(12) United States Patent
Heald et al.

(10) Patent No.: US 8,068,268 B2
(45) Date of Patent: Nov. 29, 2011

(54) MEMS DEVICES HAVING IMPROVED UNIFORMITY AND METHODS FOR MAKING THEM

(75) Inventors: David L Heald, Solvang, CA (US); Fan Zhong, Fremont, CA (US); Philip Don Floyd, Redwood City, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 1156 days.

(21) Appl. No.: 11/773,357

(22) Filed: Jul. 3, 2007

(65) Prior Publication Data

US 2009/0009444 A1    Jan. 8, 2009

(51) Int. Cl.
G02B 26/00    (2006.01)
(52) U.S. Cl. ......................................... 359/290; 359/291
(58) Field of Classification Search .................. 359/290, 359/291
See application file for complete search history.

(56) References Cited

U.S. PATENT DOCUMENTS

| | | |
|---|---|---|
| 3,728,030 A | 4/1973 | Hawes |
| 3,955,880 A | 5/1976 | Lierke |
| 4,377,324 A | 3/1983 | Durand et al. |
| 4,482,213 A | 11/1984 | Piliavin et al. |
| 4,519,676 A | 5/1985 | te Velde |
| 4,566,935 A | 1/1986 | Hornbeck |
| 4,710,732 A | 12/1987 | Hornbeck |
| 4,786,128 A | 11/1988 | Birnbach |
| 4,790,635 A | 12/1988 | Apsley |
| 4,859,060 A | 8/1989 | Katagiri et al. |
| 4,900,136 A | 2/1990 | Goldburt et al. |
| 4,956,619 A | 9/1990 | Hornbeck |
| 4,965,562 A | 10/1990 | Verhulst |
| 5,022,745 A | 6/1991 | Zayhowski et al. |
| 5,044,736 A | 9/1991 | Jaskie et al. |
| 5,075,796 A | 12/1991 | Schildkraut et al. |
| 5,099,353 A | 3/1992 | Hornbeck |
| 5,124,834 A | 6/1992 | Cusano et al. |
| 5,168,406 A | 12/1992 | Nelson |
| 5,172,262 A | 12/1992 | Hornbeck |
| 5,192,395 A | 3/1993 | Boysel et al. |
| 5,212,582 A | 5/1993 | Nelson |
| 5,226,099 A | 7/1993 | Mignardi et al. |

(Continued)

FOREIGN PATENT DOCUMENTS

CH    680534    9/1992

(Continued)

OTHER PUBLICATIONS

IPRP for PCT/US08/068205, dated Jan. 14, 2010.

(Continued)

*Primary Examiner* — Ricky Mack
*Assistant Examiner* — James Jones
(74) *Attorney, Agent, or Firm* — Knobbe Martens Olson & Bear LLP

(57) ABSTRACT

Disclosed is a microelectromechanical system (MEMS) device and method of manufacturing the same. In one aspect, MEMS such as an interferometric modulator include one or more elongated interior posts and support rails supporting a deformable reflective layer, where the elongated interior posts are entirely within an interferometric cavity and aligned parallel with the support rails. In another aspect, the interferometric modulator includes one or more elongated etch release holes formed in the deformable reflective layer and aligned parallel with channels formed in the deformable reflective layer defining parallel strips of the deformable reflective layer.

36 Claims, 13 Drawing Sheets

U.S. PATENT DOCUMENTS

| | | |
|---|---|---|
| 5,231,532 A | 7/1993 | Magel et al. |
| 5,233,456 A | 8/1993 | Nelson |
| 5,287,215 A | 2/1994 | Warde et al. |
| 5,293,272 A | 3/1994 | Jannson et al. |
| 5,311,360 A | 5/1994 | Bloom et al. |
| 5,312,512 A | 5/1994 | Allman et al. |
| 5,345,328 A | 9/1994 | Fritz et al. |
| 5,347,377 A | 9/1994 | Revelli, Jr. et al. |
| 5,381,232 A | 1/1995 | van Wijk |
| 5,452,138 A | 9/1995 | Mignardi et al. |
| 5,454,906 A | 10/1995 | Baker et al. |
| 5,485,304 A | 1/1996 | Kaeriyama |
| 5,489,952 A | 2/1996 | Gove et al. |
| 5,497,262 A | 3/1996 | Kaeriyama |
| 5,500,761 A | 3/1996 | Goossen et al. |
| 5,526,172 A | 6/1996 | Kanack |
| 5,526,951 A | 6/1996 | Bailey et al. |
| 5,535,047 A | 7/1996 | Hornbeck |
| 5,552,924 A | 9/1996 | Tregilgas |
| 5,559,358 A | 9/1996 | Burns et al. |
| 5,578,976 A | 11/1996 | Yao |
| 5,600,383 A | 2/1997 | Hornbeck |
| 5,606,441 A | 2/1997 | Florence et al. |
| 5,608,468 A | 3/1997 | Gove et al. |
| 5,619,059 A | 4/1997 | Li et al. |
| 5,619,365 A | 4/1997 | Rhoads et al. |
| 5,619,366 A | 4/1997 | Rhoads et al. |
| 5,629,790 A | 5/1997 | Neukermans et al. |
| 5,631,782 A | 5/1997 | Smith et al. |
| 5,638,946 A | 6/1997 | Zavracky |
| 5,646,768 A | 7/1997 | Kaeiyama |
| 5,650,881 A | 7/1997 | Hornbeck |
| 5,673,139 A | 9/1997 | Johnson |
| 5,690,839 A | 11/1997 | Min |
| 5,699,181 A | 12/1997 | Choi |
| 5,710,656 A | 1/1998 | Goossen |
| 5,739,945 A | 4/1998 | Tayebati |
| 5,745,281 A | 4/1998 | Yi et al. |
| 5,751,469 A | 5/1998 | Arney et al. |
| 5,771,321 A | 6/1998 | Stern |
| 5,783,864 A | 7/1998 | Dawson et al. |
| 5,784,189 A | 7/1998 | Bozler et al. |
| 5,784,212 A | 7/1998 | Hornbeck |
| 5,808,781 A | 9/1998 | Arney et al. |
| 5,822,110 A | 10/1998 | Dabbaj |
| 5,825,528 A | 10/1998 | Goossen |
| 5,838,484 A | 11/1998 | Goossen et al. |
| 5,867,302 A | 2/1999 | Fleming et al. |
| 5,896,796 A | 4/1999 | Chih |
| 5,914,803 A | 6/1999 | Hwang et al. |
| 5,914,804 A | 6/1999 | Goossen |
| 5,920,421 A | 7/1999 | Choi |
| 5,943,155 A | 8/1999 | Goossen |
| 5,943,158 A | 8/1999 | Ford et al. |
| 5,959,763 A | 9/1999 | Bozler et al. |
| 5,972,193 A | 10/1999 | Chou et al. |
| 5,978,127 A | 11/1999 | Berg |
| 5,986,796 A | 11/1999 | Miles |
| 5,998,293 A | 12/1999 | Dawson et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,097,145 A | 8/2000 | Kastalsky et al. |
| 6,100,477 A | 8/2000 | Randall et al. |
| 6,104,525 A | 8/2000 | Min |
| 6,137,182 A | 10/2000 | Hause et al. |
| 6,170,332 B1 | 1/2001 | MacDonald et al. |
| 6,201,633 B1 | 3/2001 | Peeters et al. |
| 6,249,039 B1 | 6/2001 | Harvey et al. |
| 6,282,010 B1 | 8/2001 | Sulzbach et al. |
| 6,284,560 B1 | 9/2001 | Jech et al. |
| 6,288,824 B1 | 9/2001 | Kastalsky |
| 6,295,154 B1 | 9/2001 | Laor et al. |
| 6,324,192 B1 | 11/2001 | Tayebati |
| 6,327,071 B1 | 12/2001 | Kimura et al. |
| 6,351,329 B1 | 2/2002 | Greywall |
| 6,356,378 B1 | 3/2002 | Huibers |
| 6,358,021 B1 | 3/2002 | Cabuz |
| 6,391,675 B1 | 5/2002 | Ehmke et al. |
| 6,407,851 B1 | 6/2002 | Islam et al. |
| 6,447,126 B1 | 9/2002 | Hornbeck |
| 6,449,084 B1 | 9/2002 | Guo |
| 6,465,355 B1 | 10/2002 | Horsley |
| 6,466,354 B1 | 10/2002 | Gudeman |
| 6,473,072 B1 | 10/2002 | Comiskey et al. |
| 6,513,911 B1 | 2/2003 | Ozaki et al. |
| 6,522,801 B1 | 2/2003 | Aksyuk et al. |
| 6,537,427 B1 | 3/2003 | Raina et al. |
| 6,574,033 B1 | 6/2003 | Chui et al. |
| 6,577,785 B1 | 6/2003 | Spahn et al. |
| 6,597,490 B2 | 7/2003 | Tayebati |
| 6,602,791 B2 | 8/2003 | Ouellet et al. |
| 6,618,187 B2 | 9/2003 | Pilossof |
| 6,625,047 B2 | 9/2003 | Coleman, Jr. |
| 6,632,698 B2 | 10/2003 | Ives |
| 6,642,913 B1 | 11/2003 | Kimura et al. |
| 6,650,455 B2 | 11/2003 | Miles |
| 6,653,997 B2 | 11/2003 | Van Gorkom et al. |
| 6,657,832 B2 | 12/2003 | Williams et al. |
| 6,674,562 B1 | 1/2004 | Miles |
| 6,677,225 B1 | 1/2004 | Ellis et al. |
| 6,680,792 B2 | 1/2004 | Miles |
| 6,704,475 B2 | 3/2004 | Jin et al. |
| 6,707,594 B2 | 3/2004 | Holmes |
| 6,710,908 B2 | 3/2004 | Miles et al. |
| 6,713,235 B1 | 3/2004 | Ide et al. |
| 6,760,146 B2 | 7/2004 | Ikeda et al. |
| 6,778,306 B2 | 8/2004 | Sniegowski et al. |
| 6,778,728 B2 | 8/2004 | Taylor |
| 6,788,175 B1 | 9/2004 | Prophet et al. |
| 6,794,119 B2 | 9/2004 | Miles |
| 6,803,534 B1 | 10/2004 | Chen et al. |
| 6,859,301 B1 | 2/2005 | Islam et al. |
| 6,867,896 B2 | 3/2005 | Miles |
| 6,881,535 B2 | 4/2005 | Yamaguchi |
| 6,882,458 B2 | 4/2005 | Lin et al. |
| 6,906,849 B1 | 6/2005 | Mi et al. |
| 6,940,631 B2 | 9/2005 | Ishikawa |
| 6,951,824 B2 | 10/2005 | Fischer et al. |
| 6,958,847 B2 | 10/2005 | Lin |
| 6,967,757 B1 | 11/2005 | Allen et al. |
| 6,980,350 B2 | 12/2005 | Hung et al. |
| 6,982,820 B2 | 1/2006 | Tsai |
| 6,987,432 B2 | 1/2006 | Lutz et al. |
| 6,991,995 B2 | 1/2006 | Aulnette et al. |
| 6,995,890 B2 | 2/2006 | Lin |
| 7,006,272 B2 | 2/2006 | Tsai |
| 7,016,095 B2 | 3/2006 | Lin |
| 7,016,099 B2 | 3/2006 | Ikeda et al. |
| 7,027,202 B1 | 4/2006 | Hunter et al. |
| 7,041,571 B2 | 5/2006 | Strane |
| 7,042,619 B1 | 5/2006 | McGinley et al. |
| 7,042,643 B2 | 5/2006 | Miles et al. |
| 7,078,293 B2 | 7/2006 | Lin et al. |
| 7,110,158 B2 | 9/2006 | Miles |
| 7,119,945 B2 | 10/2006 | Cummings et al. |
| 7,123,216 B1 | 10/2006 | Miles |
| 7,161,730 B2 | 1/2007 | Floyd |
| 7,193,768 B2 | 3/2007 | Lin |
| 7,198,973 B2 | 4/2007 | Lin et al. |
| 7,233,029 B2 | 6/2007 | Mochizuki |
| 7,250,315 B2 | 7/2007 | Miles |
| 7,289,259 B2 | 10/2007 | Chui et al. |
| 7,321,457 B2 | 1/2008 | Heald |
| 7,417,784 B2 | 8/2008 | Sasagawa et al. |
| 7,550,810 B2 | 6/2009 | Mignard et al. |
| 2001/0003487 A1 | 6/2001 | Miles |
| 2001/0010953 A1 | 8/2001 | Kang et al. |
| 2001/0026951 A1 | 10/2001 | Vergani et al. |
| 2001/0028503 A1 | 10/2001 | Flanders et al. |
| 2001/0040675 A1 | 11/2001 | True et al. |
| 2001/0044165 A1 | 11/2001 | Lee et al. |
| 2001/0055208 A1 | 12/2001 | Kimura |
| 2002/0027636 A1 | 3/2002 | Yamada |
| 2002/0031155 A1 | 3/2002 | Tayebati et al. |
| 2002/0054422 A1 | 5/2002 | Carr et al. |

| Publication No. | Date | Name |
|---|---|---|
| 2002/0055253 A1 | 5/2002 | Rudhard |
| 2002/0058422 A1 | 5/2002 | Jang et al. |
| 2002/0071169 A1 | 6/2002 | Bowers et al. |
| 2002/0075555 A1 | 6/2002 | Miles |
| 2002/0109899 A1 | 8/2002 | Ohtaka et al. |
| 2002/0110948 A1 | 8/2002 | Huang et al. |
| 2002/0131682 A1 | 9/2002 | Nasiri et al. |
| 2002/0135857 A1 | 9/2002 | Fitzpatrick et al. |
| 2002/0141690 A1 | 10/2002 | Jin et al. |
| 2002/0146200 A1 | 10/2002 | Kudrle et al. |
| 2002/0149850 A1 | 10/2002 | Heffner et al. |
| 2002/0168136 A1 | 11/2002 | Atia et al. |
| 2002/0186483 A1 | 12/2002 | Hagelin et al. |
| 2002/0195681 A1 | 12/2002 | Melendez et al. |
| 2003/0015936 A1 | 1/2003 | Yoon et al. |
| 2003/0016428 A1 | 1/2003 | Kato et al. |
| 2003/0036215 A1 | 2/2003 | Reid |
| 2003/0053078 A1 | 3/2003 | Missey et al. |
| 2003/0053233 A1 | 3/2003 | Felton |
| 2003/0072070 A1 | 4/2003 | Miles |
| 2003/0091072 A1 | 5/2003 | Wang et al. |
| 2003/0112096 A1 | 6/2003 | Potter |
| 2003/0119221 A1 | 6/2003 | Cunningham et al. |
| 2003/0123126 A1 | 7/2003 | Meyer et al. |
| 2003/0138213 A1 | 7/2003 | Jin et al. |
| 2003/0164350 A1 | 9/2003 | Hanson et al. |
| 2003/0201784 A1 | 10/2003 | Potter |
| 2003/0210851 A1 | 11/2003 | Fu et al. |
| 2003/0231373 A1 | 12/2003 | Kowarz et al. |
| 2004/0008396 A1 | 1/2004 | Stappaerts |
| 2004/0027671 A1 | 2/2004 | Wu et al. |
| 2004/0035821 A1 | 2/2004 | Doan et al. |
| 2004/0051929 A1 | 3/2004 | Sampsell et al. |
| 2004/0056742 A1 | 3/2004 | Dabbaj |
| 2004/0058532 A1 | 3/2004 | Miles et al. |
| 2004/0070813 A1 | 4/2004 | Aubuchon |
| 2004/0080035 A1 | 4/2004 | Delapierre |
| 2004/0080807 A1 | 4/2004 | Chen et al. |
| 2004/0100680 A1 | 5/2004 | Huibers et al. |
| 2004/0124073 A1 | 7/2004 | Pillans et al. |
| 2004/0125281 A1 | 7/2004 | Lin |
| 2004/0125347 A1 | 7/2004 | Patel et al. |
| 2004/0136045 A1 | 7/2004 | Tran |
| 2004/0136076 A1 | 7/2004 | Tayebati |
| 2004/0150869 A1 | 8/2004 | Kasai |
| 2004/0174583 A1 | 9/2004 | Chen et al. |
| 2004/0201908 A1 | 10/2004 | Kaneko |
| 2004/0207497 A1 | 10/2004 | Hsu et al. |
| 2004/0207898 A1 | 10/2004 | Lin et al. |
| 2004/0209195 A1 | 10/2004 | Lin |
| 2004/0217919 A1 | 11/2004 | Piehl et al. |
| 2004/0226909 A1 | 11/2004 | Tzeng |
| 2004/0233498 A1 | 11/2004 | Starkweather et al. |
| 2004/0233553 A1 | 11/2004 | Shibata et al. |
| 2004/0240032 A1 | 12/2004 | Miles |
| 2005/0024557 A1 | 2/2005 | Lin |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0078348 A1 | 4/2005 | Lin |
| 2005/0128565 A1 | 6/2005 | Ljungblad |
| 2005/0195464 A1 | 9/2005 | Faase et al. |
| 2005/0195467 A1 | 9/2005 | Kothari et al. |
| 2005/0231793 A1 | 10/2005 | Sato |
| 2005/0249966 A1 | 11/2005 | Tung et al. |
| 2006/0006138 A1 | 1/2006 | Lin |
| 2006/0018348 A1 | 1/2006 | Przybyla et al. |
| 2006/0024620 A1 | 2/2006 | Nikkel et al. |
| 2006/0066511 A1 | 3/2006 | Chui |
| 2006/0066932 A1 | 3/2006 | Chui |
| 2006/0066935 A1 | 3/2006 | Cummings et al. |
| 2006/0066936 A1 | 3/2006 | Chui et al. |
| 2006/0076311 A1 | 4/2006 | Tung et al. |
| 2006/0077502 A1 | 4/2006 | Tung et al. |
| 2006/0077509 A1 | 4/2006 | Tung et al. |
| 2006/0077518 A1 | 4/2006 | Chui et al. |
| 2006/0079048 A1 | 4/2006 | Sampsell et al. |
| 2006/0119922 A1 | 6/2006 | Faase et al. |
| 2006/0203325 A1 | 9/2006 | Faase et al. |
| 2006/0256420 A1 | 11/2006 | Miles et al. |
| 2007/0019280 A1 | 1/2007 | Sasagawa et al. |
| 2007/0019923 A1 | 1/2007 | Sasagawa et al. |
| 2007/0041076 A1 | 2/2007 | Zhong et al. |
| 2007/0041703 A1 | 2/2007 | Wang |
| 2007/0042524 A1 | 2/2007 | Kogut et al. |
| 2007/0047900 A1 | 3/2007 | Sampsell et al. |
| 2007/0064760 A1 | 3/2007 | Kragh |
| 2007/0096300 A1 | 5/2007 | Wang et al. |
| 2007/0170540 A1 | 7/2007 | Chung et al. |
| 2007/0247401 A1 | 10/2007 | Sasagawa et al. |
| 2007/0249079 A1 | 10/2007 | Sasagawa et al. |
| 2007/0269748 A1 | 11/2007 | Miles |
| 2007/0279753 A1 | 12/2007 | Tung et al. |
| 2008/0026328 A1 | 1/2008 | Miles |
| 2008/0030825 A1 | 2/2008 | Sasagawa et al. |
| 2008/0041817 A1 | 2/2008 | Lin |
| 2008/0055699 A1 | 3/2008 | Lin |
| 2008/0068699 A1 | 3/2008 | Miles |
| 2008/0094686 A1 | 4/2008 | U'Ren |
| 2008/0100899 A1 | 5/2008 | Shimokawa et al. |
| 2008/0144163 A1 | 6/2008 | Floyd |
| 2008/0151352 A1 | 6/2008 | Chung et al. |
| 2008/0158645 A1 | 7/2008 | Chiang |
| 2008/0180783 A1 | 7/2008 | Wang et al. |
| 2008/0226929 A1 | 9/2008 | Chung et al. |
| 2008/0279498 A1 | 11/2008 | Sampsell et al. |
| 2008/0310008 A1 | 12/2008 | Chan |
| 2008/0314866 A1 | 12/2008 | Chui et al. |
| 2009/0315567 A1 | 12/2009 | Chou et al. |
| 2010/0019336 A1 | 1/2010 | Sasagawa et al. |
| 2010/0044808 A1 | 2/2010 | Dekker et al. |
| 2010/0147790 A1 | 6/2010 | Sasagawa et al. |
| 2010/0149627 A1 | 6/2010 | Sasagawa et al. |
| 2010/0182675 A1* | 7/2010 | Sampsell et al. ............... 359/290 |
| 2010/0202039 A1 | 8/2010 | Kogut et al. |

FOREIGN PATENT DOCUMENTS

| | | |
|---|---|---|
| CN | 092109265 | 4/2003 |
| DE | 10228946 | 1/2004 |
| DE | 198 47 455 | 4/2004 |
| EP | 0 069 226 | 1/1983 |
| EP | 0 035 299 | 9/1983 |
| EP | 0 695 959 | 2/1996 |
| EP | 0 758 080 | 2/1997 |
| EP | 0 788 005 | 8/1997 |
| EP | 1 170 618 | 1/2002 |
| EP | 1 197 778 | 4/2002 |
| EP | 1 275 997 | 1/2003 |
| EP | 1 484 635 | 12/2004 |
| FR | 2824643 | 10/1999 |
| JP | 06301054 | 10/1994 |
| JP | 08293580 | 11/1996 |
| JP | 9-127439 | 5/1997 |
| JP | 11-097799 | 4/1999 |
| JP | 2001-085519 | 3/2001 |
| JP | 2002-062490 | 2/2002 |
| JP | 2002-207182 | 7/2002 |
| JP | 2002-277771 | 9/2002 |
| JP | 2002-341267 | 11/2002 |
| JP | 2003-021798 | 1/2003 |
| JP | 2003-215475 | 7/2003 |
| JP | 2004-141995 | 5/2004 |
| JP | 2004157527 | 6/2004 |
| JP | 2004-212656 | 7/2004 |
| JP | 2004-326072 | 11/2004 |
| WO | WO 01/56919 | 8/2001 |
| WO | WO 02/38491 | 5/2002 |
| WO | WO 02/079853 | 10/2002 |
| WO | WO 03/014789 | 2/2003 |
| WO | WO 04/000717 | 12/2003 |
| WO | WO 2004/015741 | 2/2004 |
| WO | WO 2004/055885 | 7/2004 |
| WO | WO 2005/006364 | 1/2005 |
| WO | WO 2006/073111 | 7/2006 |
| WO | WO 2007/014022 | 2/2007 |

OTHER PUBLICATIONS

Partial European Search Report for App. No. 08153313.5, dated May 4, 2009.

Invitation to Pay Additional Fees for PCT/US08/068205, filed Jun. 25, 2008.

Dai et al., "A CMOS surface micromachined pressure sensor," Journal of the Chinese institute of Engineers, 1999, vol. 22, No. 3 (May), pp. 375-380.

Lee et al., "Improvement of the surface characteristics of sputtered metal layer for a MEMS micro-mirror switch," Thin Solid Films, vol. 447, Jan. 30, 2004, pp. 615-618.

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Fan et al., "Channel Drop Filters in Photonic Crystals," Optics Express, vol. 3, No. 1 (1998).

Goossen et al., "Possible Display Applications of the Silicon Mechanical Anti-Reflection Switch," Society for Information Display (1994).

Joannopoulos et al., "Photonic Crystals: Molding the Flow of Light," Princeton University Press (1995).

Magel, "Integrated Optic Devices Using Micromachined Metal Membranes," SPIE vol. 2686, 0-8194-2060—Mar. 1996.

Raley et al., "A Fabry-Perot Microinterferometer for Visible Wavelengths," IEEE Solid-State Sensor and Actuator Workshop, Hilton Head, SC, pp. 170-173 (1992).

ISR and WO for PCT/US08/068205, dated Sep. 4, 2009.

Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.

Fork, et al., "P-67: Chip on Glass Bonding using StressedMetal™ Technology" Sid 05 Digest, May 24, 2005.

Wang et al., Flexible curcuit-based RF MEMS Switches, Proceedings of 2001 ASME International Mechanical Engineering Congress and Exposition, pp. 1-6, 2001.

Dokmeci et al., Dec. 2004, Two-axis single-crystal silicon micromirror arrays, Journal of Microelectromechanical Systems, 13(6):1006-1017.

* cited by examiner

MEMS DEVICES HAVING IMPROVED UNIFORMITY AND METHODS FOR MAKING THEM

BACKGROUND

1. Field of the Invention

This invention relates to microelectromechanical systems. More particularly, this invention relates to methods and apparatus for improving the performance of microelectromechanical systems such as interferometric modulators.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

The systems, methods, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An aspect provides a method of making a microelectromechanical system (MEMS) device. The method of this aspect includes forming a sacrificial layer over a substrate, forming three or more first channels in the sacrificial layer to thereby form at least two substantially parallel strips of the sacrificial layer, and forming support rails in the formed first channels. The method further includes forming first elongated openings in the parallel strips of the sacrificial layer, forming elongated posts in the first elongated openings, forming a deformable layer over the sacrificial layer, the support rails and the elongated posts, forming one or more second channels in the deformable layer to thereby form at least two substantially parallel strips of the deformable layer, the strips of the deformable layer being substantially perpendicular to the parallel strips of the sacrificial layer. The method further includes removing the sacrificial layer to form cavities between the parallel strips of the deformable layer and the substrate and bordered on two sides by the support rails, where the support rails support the deformable layer on the two sides of the cavities, and at least one of the elongated posts is within each of the cavities and is aligned so that the elongate direction is substantially parallel to the support rails.

Another aspect provides a method of making a microelectromechanical system (MEMS) device. The method of this aspect includes forming a sacrificial layer over a substrate, forming three or more first channels in the sacrificial layer to thereby form at least two substantially parallel strips of the sacrificial layer, forming support rails in the formed first channels, and forming a deformable layer over the sacrificial layer, and the support rails. The method further includes forming one or more second channels in the deformable layer to thereby form at least two substantially parallel strips of the deformable layer, the parallel strips of the deformable layer being substantially perpendicular to the parallel strips of the sacrificial layer, forming one or more first elongated openings in the parallel strips of the deformable layer, wherein the first elongated opening are substantially parallel to the parallel strips of the deformable layer, and removing the sacrificial layer to form cavities between the parallel strips of the deformable layer and the substrate and bordered on two sides by the support rails.

Another aspect provides a microelectromechanical system (MEMS) device. The MEMS device of this aspect includes a substrate, a plurality of deformable membranes, a plurality of support structures arranged over the substrate and configured to support the deformable membranes, and a plurality of cavities defined by the substrate, the support structures, and the deformable membranes, where the plurality of support structures comprise support rails aligned in a first direction separating the plurality of cavities into one or more rows, and at least one elongated support post located between the support rails and located entirely within each of the cavities, and further wherein the elongated support posts are aligned so that the elongate direction is substantially parallel to the support rails.

Another aspect provides a microelectromechanical systems (MEMS) device. The MEMS device of this aspect includes a substrate, two or more electrically conductive row electrodes formed on the substrate, and a plurality of support rails formed on the substrate and configured to separate the two or more row electrodes. The MEMS device further includes two or more deformable column electrodes supported by the plurality of support rails, the column electrodes being substantially perpendicular to the row electrodes, a plurality of elongated openings formed in the deformable column electrodes, where the elongated openings are aligned such that the elongate direction is substantially parallel to the column electrodes, and an array of cavities defined by the row electrodes, the support rails, and the deformable column electrodes, where at least one elongated opening is at least partially located in each of the cavities.

The Figures are schematic only, not drawn to scale.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments described herein provide MEMS devices and particularly interferometric modulator devices and methods of making the same with improved performance. In particular, embodiments for improving the uniformity of reflected color across a pixel region are described. In one aspect, the interferometric modulator includes one or more elongated interior posts and support rails supporting a deformable reflective layer, where the elongated interior posts are entirely within an interferometric cavity and aligned parallel with the support rails. In another aspect, the interferometric modulator includes one or more elongated etch release holes formed in the deformable reflective layer and aligned parallel with channels formed in the deformable reflective layer defining parallel strips of the deformable reflective layer.

Figure 1:
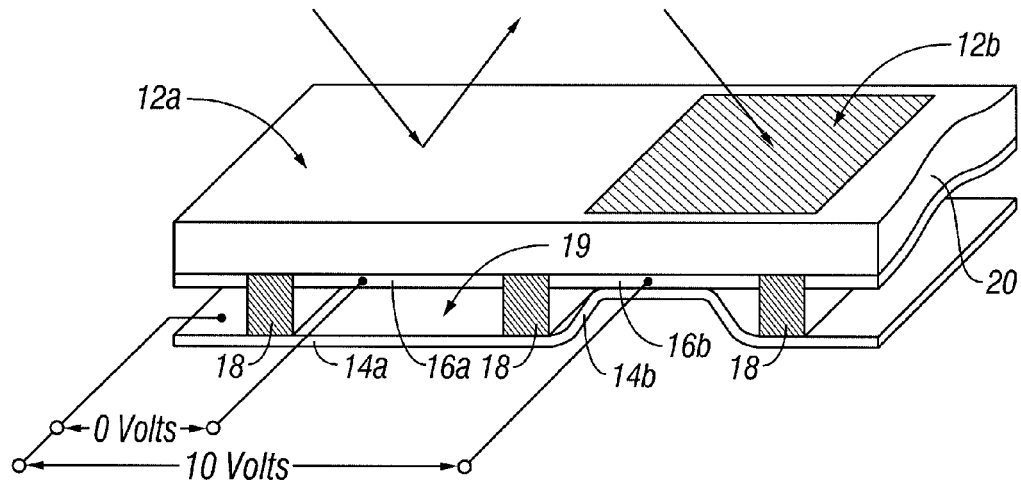
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer or membrane 14a is illustrated in a relaxed position at a predetermined distance from an optical stack 16a, which includes a partially reflective layer. In the interferometric modulator 12b on the right, the movable reflective layer or membrane 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
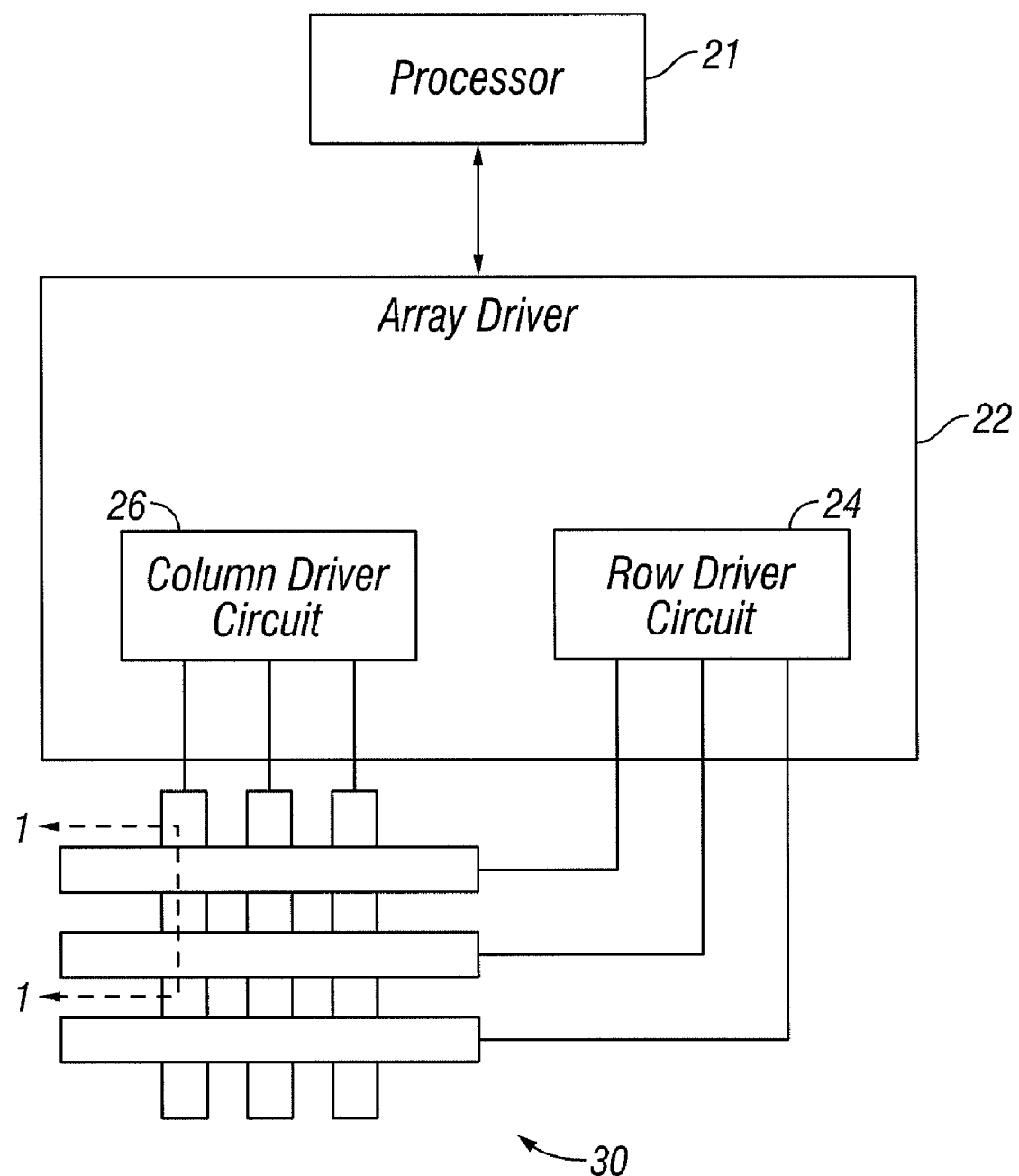
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
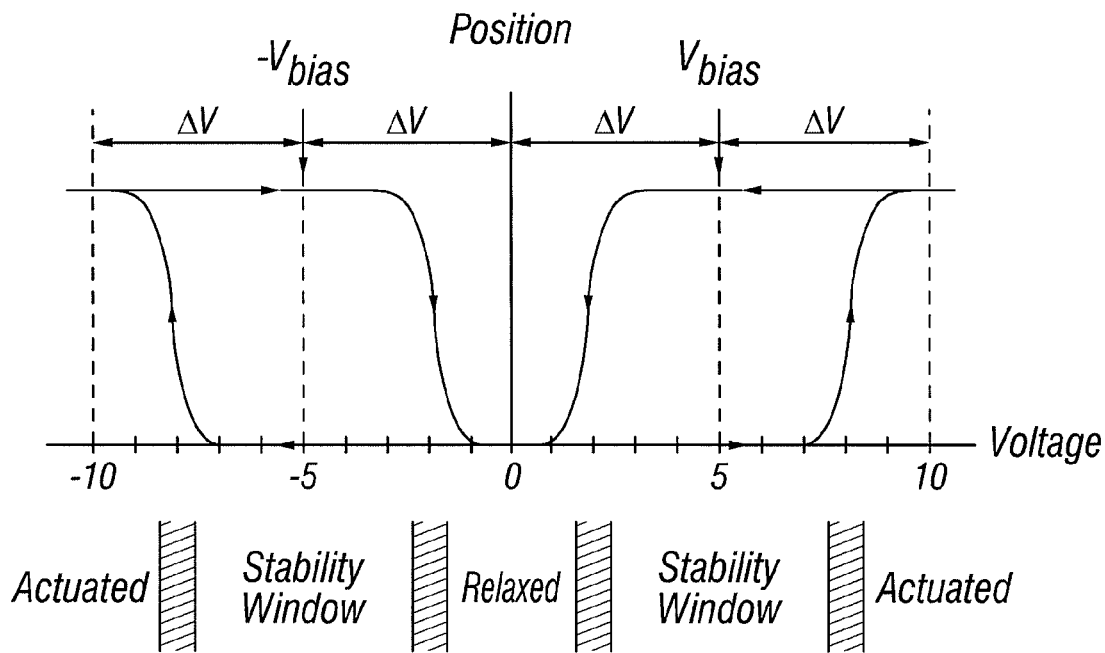
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
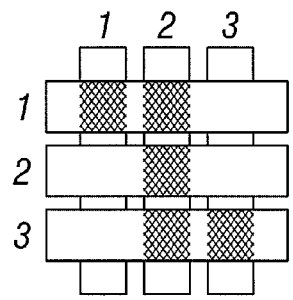
FIG. 5A illustrates one exemplary frame of display data in the 3×3 interferometric modulator display of FIG. 2.
Figure 5B:
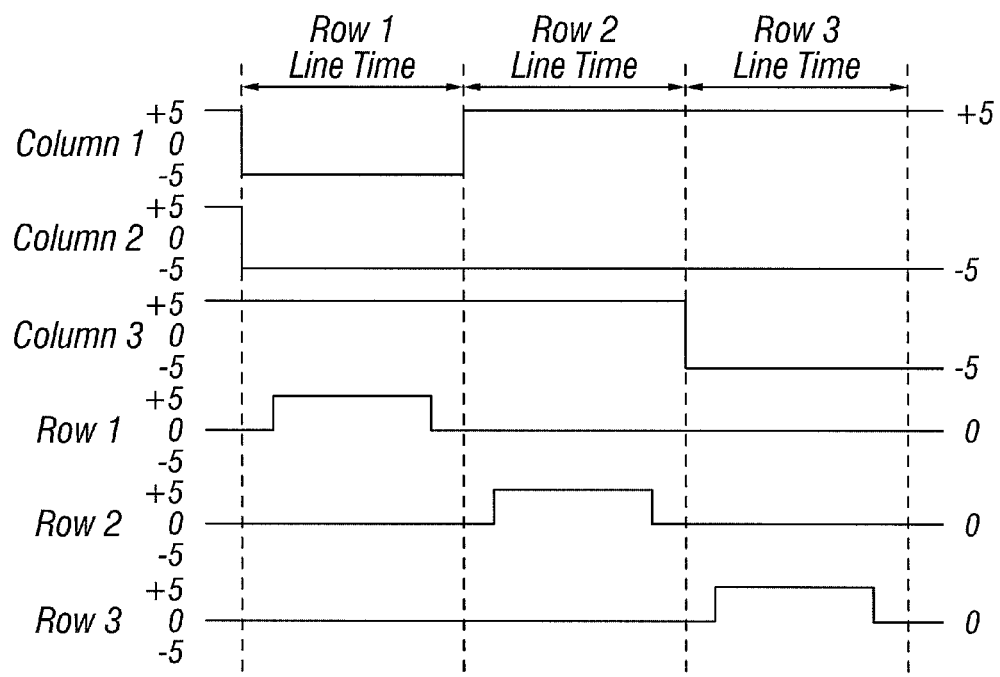
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
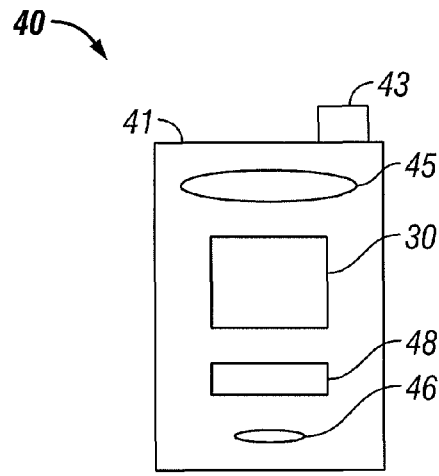
FIGS. 6A and 6B are system block diagrams illustrating an embodiment of a visual display device comprising a plurality of interferometric modulators.
Figure 6B:
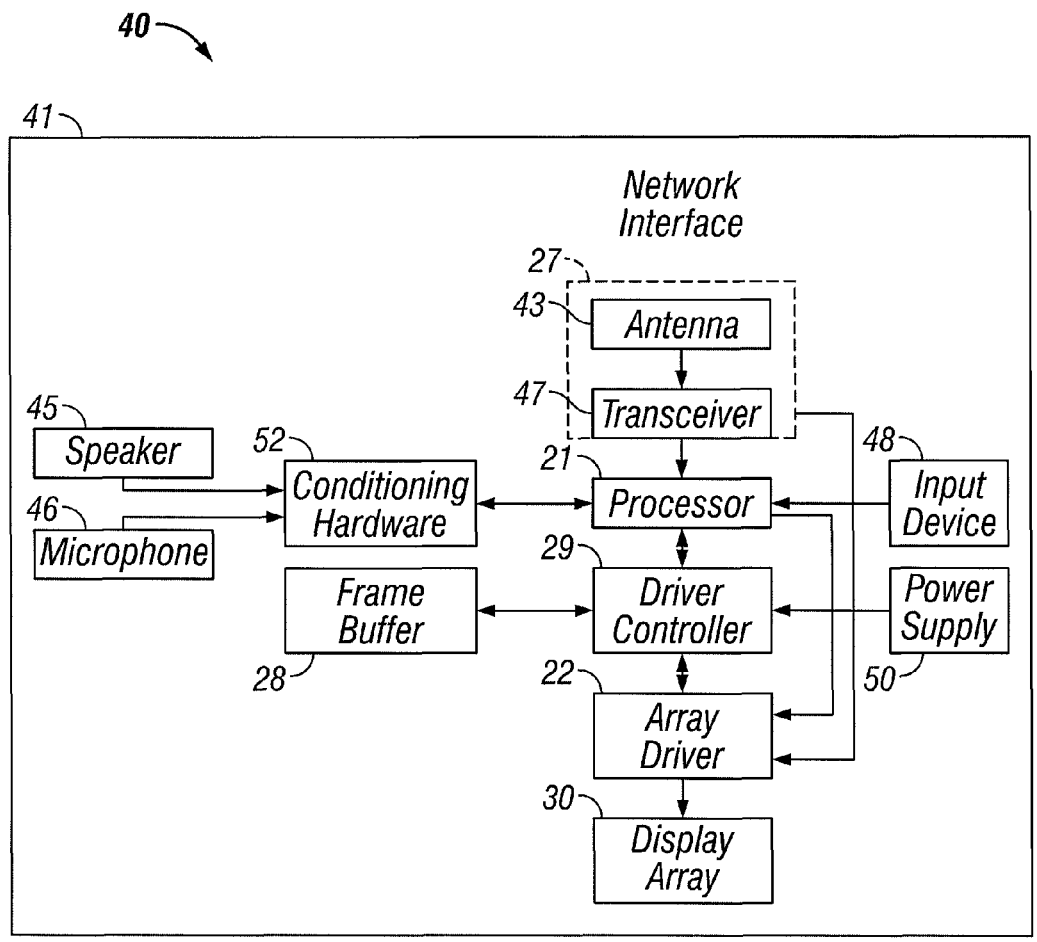

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
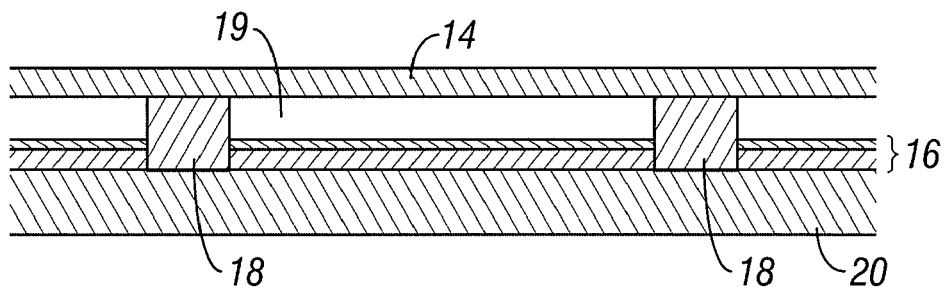
FIG. 7A is a cross section of the device of FIG. 1.
Figure 7B:
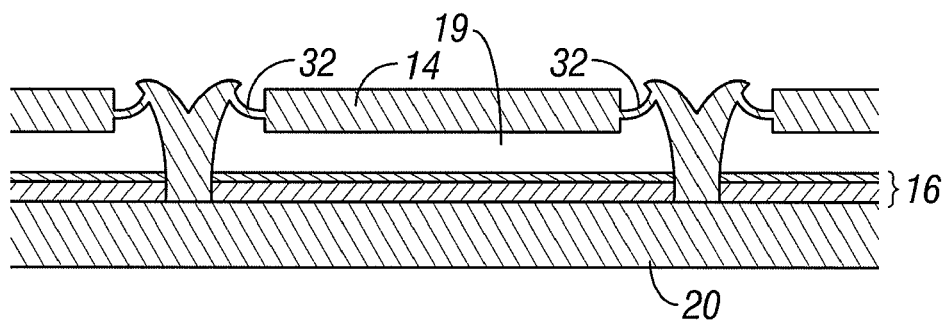
FIG. 7B is a cross section of an alternative embodiment of an interferometric modulator.
Figure 7C:
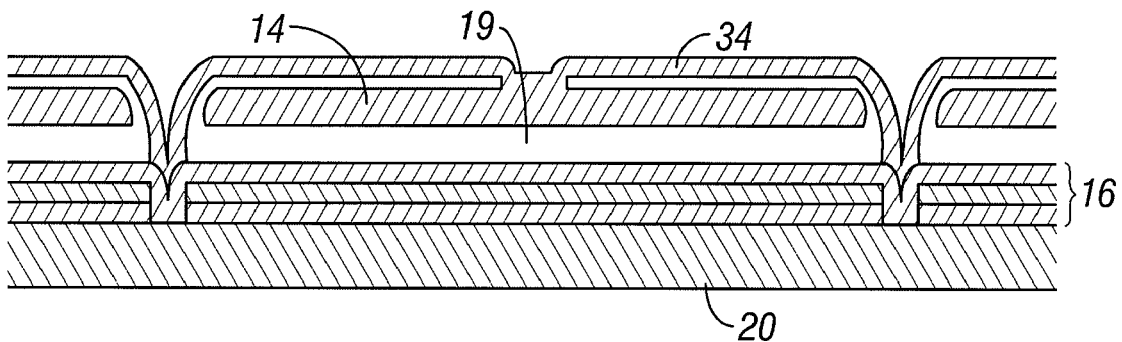
FIG. 7C is a cross section of another alternative embodiment of an interferometric modulator.
Figure 7D:
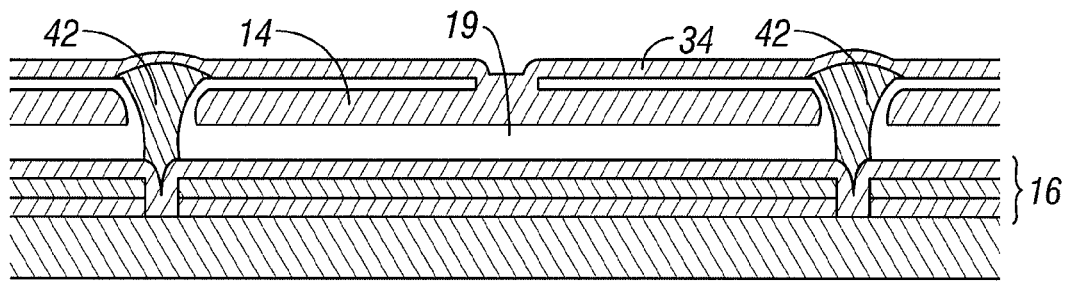
FIG. 7D is a cross section of yet another alternative embodiment of an interferometric modulator.
Figure 7E:
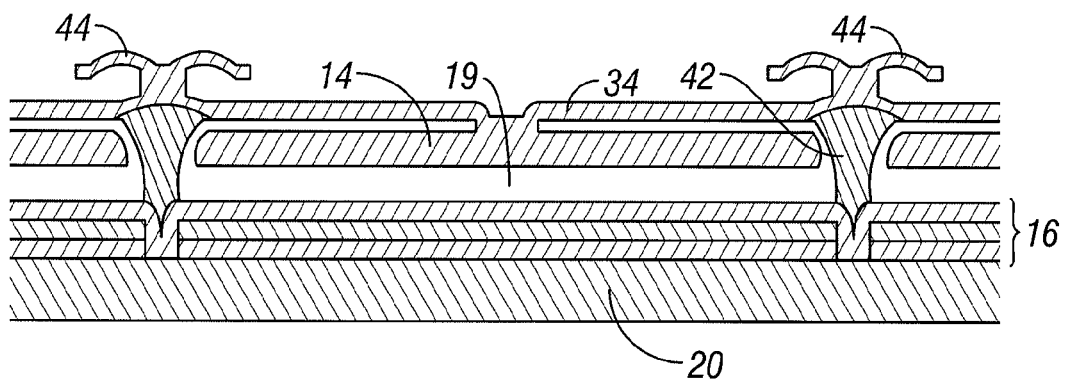
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
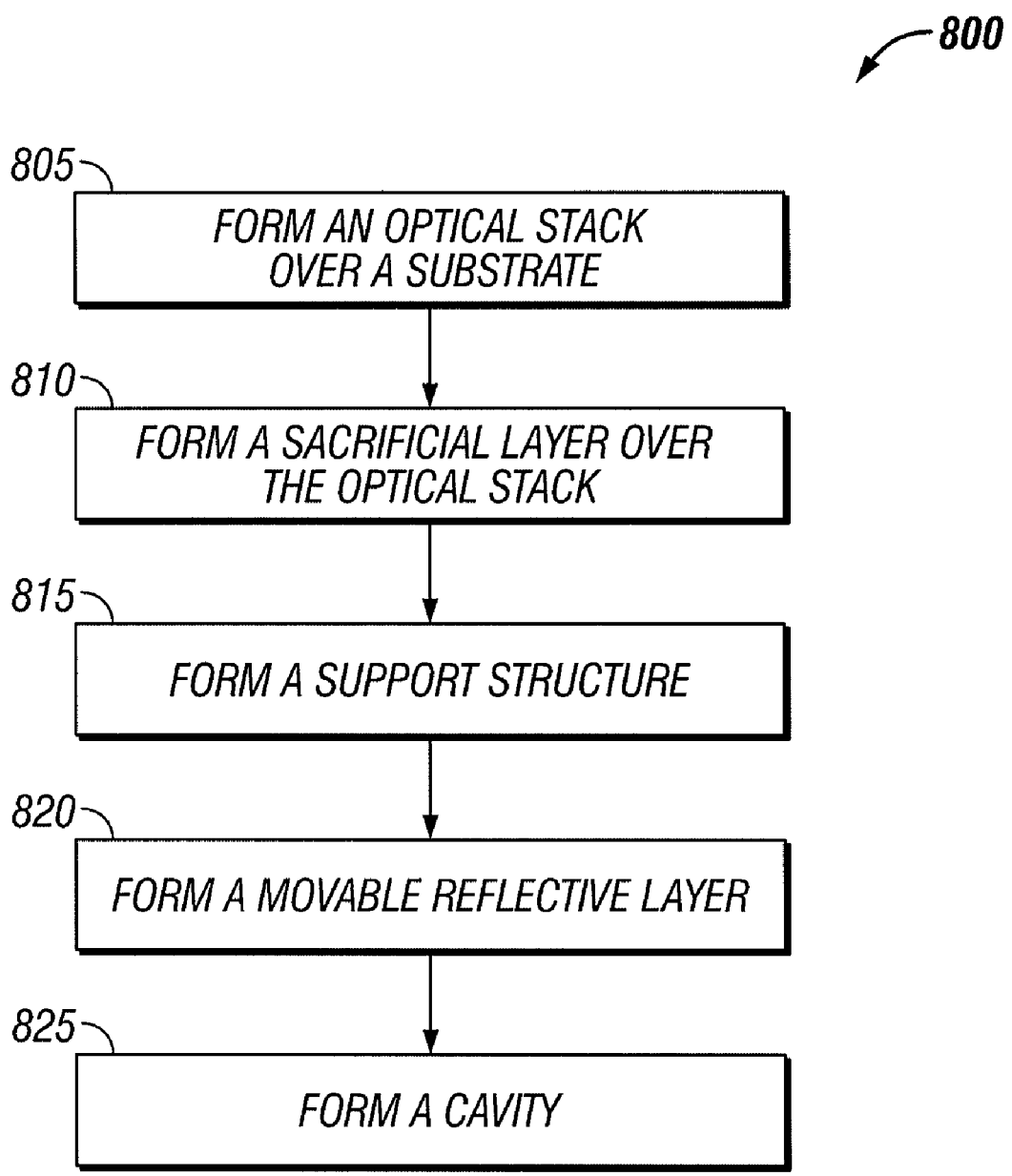
FIG. 8 is a flow diagram illustrating certain steps in an embodiment of a method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer or a silicon oxide) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer or membrane such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

Figure 9:
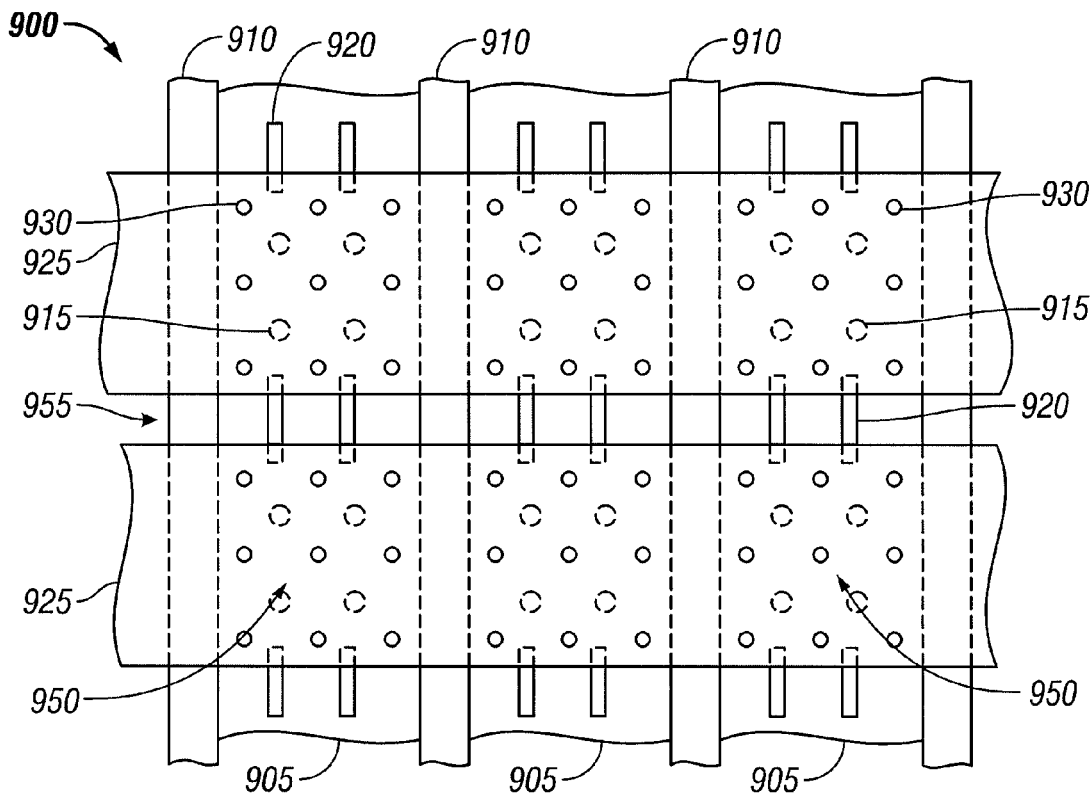
FIG. 9 is a view depicting a portion of one embodiment of an interferometric modulator display that could be manufactured using the method of FIG. 8.

FIG. 9 is a view depicting a portion of one embodiment of an interferometric modulator display 900 that may be manufactured using the method 800 of FIG. 8. The portion of the display 900 includes three row electrodes 905 that may be formed at the step 805 as part of the optical stack. Support rails 910 may be formed at step 815 in openings formed in the sacrificial layer (not shown) that was formed at step 810. The support rails 910 separate the row electrodes 905. In this embodiment, four support posts 915 are formed in the interior space between the support rails 910 of each pixel region 950. Edge posts 920 may be formed in the sacrificial layer in a border region to support edge portions of strips 925 of the deformable reflective layer or membrane. The parallel strips 925 of the movable reflective layer may be formed at step 820. The parallel strips 925 may be formed over the sacrificial layer, the support rails 910, the interior support posts 915 and the edge posts 920 so as to be supported when the sacrificial layer is removed at step 825. The pixel regions 950 are located in portions of the display 900 where the strips 925 of the deformable reflective layer overlap the row electrodes 905 formed in the optical stack. Etch release holes 930 may be formed in the pixel region 950 of the deformable reflective layer strips 925 to allow etch gasses to reach the sacrificial layer beneath the movable reflective layer strips 925 and to allow the etch by-products to vent during formation of the cavity.

It has been found that in some cases interferometric modulators having the general configuration shown in FIG. 9 have exhibited non-uniform color reflection in the un-actuated state. Without being limited by theory, it is believed that the non-uniform color reflection is due at least in part to non-uniform stress states in the parallel strips 925 of the movable reflective layer, which becomes visible after formation of the cavity 19. In the embodiment shown in FIG. 9, the support rails 910 are characterized by long edges supporting and substantially orthogonal to the parallel strips 925 of the movable reflective layer. The interior support posts 915, on the other hand, have a generally circular cross section where they support the parallel strips 925. The edge posts 920 exhibit a small rectangular cross section (or circular cross section in some embodiments) where they support the parallel strips 925 in the areas below the channels 955 cut in the deformable reflective layer to form the parallel strips 925. The etch release holes 930 also have a small generally circular cross section. It is believed that the dissimilarly shaped posts (e.g., the long support rails 910, the small circular interior posts 915 and the narrow edge posts 920) contribute to the non-uniform stress state of the parallel strips 925 of the movable reflective layer. The non-uniform stress in the parallel strips 925 of the movable reflective layer may cause different departure angles at edges of the various support structures upon release of the sacrificial layer due in part to the different cross sections. These different departure angles may cause differing amounts of interferometric modulation of incident light, thereby reflecting different colors. In addition, it is believed that the dissimilarly shaped cuts in the parallel strips 925 (e.g., the long channels 955 between the parallel strips 925, and the small circular etch release holes 930) also contribute to the non-uniform stress state of the parallel strips 925.

Figure 10:
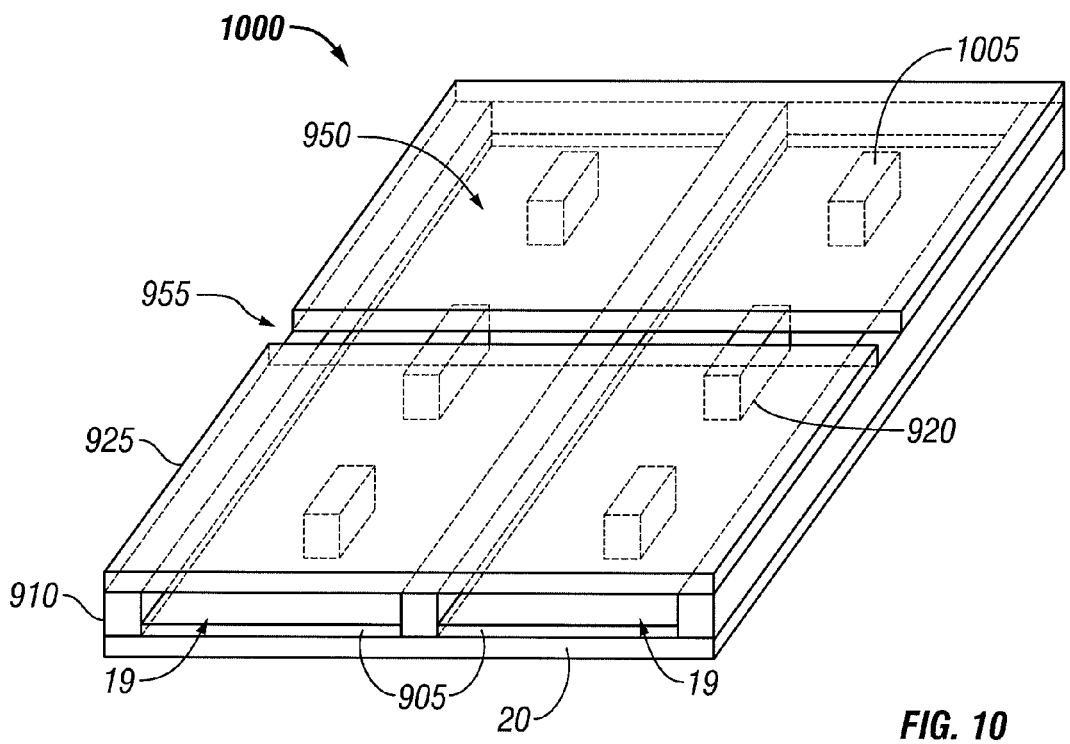
FIG. 10 is an isometric view depicting a portion of one embodiment of an interferometric modulator display in which elongated support posts are located in the interior of a cavity between the row electrodes and the movable reflective layer.

It has been found that making support posts and/or etch release holes with cross sections that are shaped more similarly to the long support rails and/or channels cut in the movable reflective layer, can improve the uniformity of the stress-state of the movable reflective layer. Thus the uniformity of reflected color across a pixel is also improved. FIG. 10 is an isometric view depicting a portion of one embodiment of an interferometric modulator display 1000 in which elongated support posts are located in the interior of a cavity 19 between the row electrodes 905 and the movable reflective layer 925. The display 1000 includes components similar to the display 900 of FIG. 9 formed over a transparent substrate 20. For example, the display 1000 includes row electrodes 905, support rails 910, edge posts 920, parallel strips 925 of the deformable reflective layer or membrane separated by channels 955, pixel regions 950, and the cavity 19 formed upon removal of a sacrificial layer between the deformable layer strips 925 and the row electrodes 905. Those skilled in the art will understand that row electrodes are the electrically conductive portions of the optical stack. For example, in some embodiments, reference to the row electrodes 905 will be understood as a reference to the electrically conductive metal layer(s) (e.g., ITO) of the optical stack 16 illustrated in FIGS. 7A-7E. In these embodiments, it will be understood that other layer(s) of the optical stack, e.g., a transparent dielectric layer, may also be present. Thus, although drawings depicting the row electrodes 905 may omit other layer(s) of the optical stack for clarity, those skilled in the art will understand that such other layer(s) may be present as desired for particular applications.

The display 1000 differs from the display 900 at least in regards to the interior support posts. The interior support posts 915 of the display 900 comprise a generally circular cross section. Instead of interior support posts with circular cross sections, the display 1000 includes elongated support posts 1005 in the interior of the pixel regions 950. The elongated support posts are formed in the interior space of the pixel region 950 between the support rails 910 and away from the channels 955 (only one channel 955 is shown in FIG. 10). The elongated posts 1005 are aligned so that the elongate direction is substantially parallel to the support rails 910. It is believed that because the elongated posts 1005 are similar in cross section (as viewed from above or below through the parallel strips 925 or through the row electrodes 905) to the edge posts 920 and elongated in the same direction as the support rails 910, the stress state of the parallel strips 925 are more uniform after release of the sacrificial layer. The example display 1000 in FIG. 10 has only one elongated post 1005 in each of the pixel regions 950. Other embodiments may have more elongated interior support posts 1005. Similarly, the example display 1000 has one edge post 920 between two pixel regions 950. Other embodiments may have more edge posts 920. The display 1000 may also have etch release holes (not shown) formed in the parallel strips 925.

The elongated posts 1005 are depicted as having a rectangular cross section as viewed from above or below. Other elongated cross sections may also be used such as, for example, elliptical, columns with rounded ends, and others.

Figure 11:
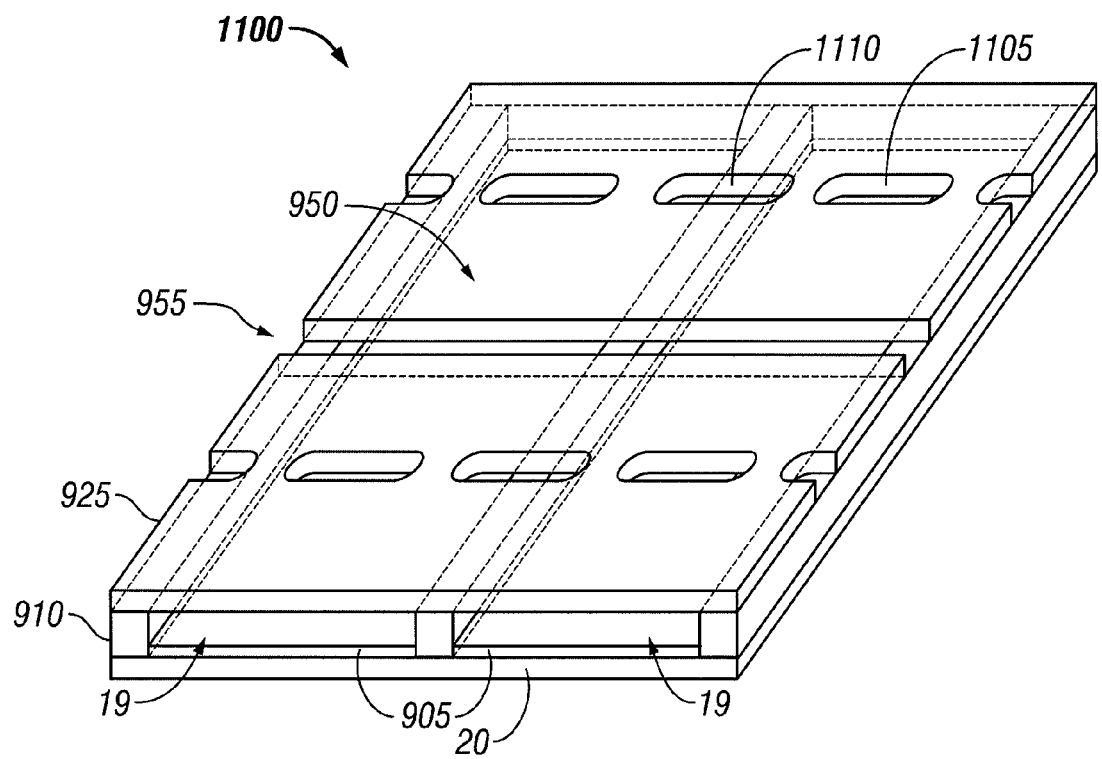
FIG. 11 is an isometric view depicting a portion of one embodiment of an interferometric modulator display in which elongated release holes are formed in the movable reflective layer.

FIG. 11 is an isometric view depicting a portion of one embodiment of an interferometric modulator display in which elongated etch release holes are formed in the movable reflective layer. The display 1100 includes components similar to the display 900 of FIG. 9 formed over a transparent substrate 20. For example, the display 1100 includes row electrodes 905, support rails 910, parallel movable reflective layer strips 925 separated by channels 955, pixel regions 950, and the cavity 19 formed upon removal of a sacrificial layer between the deformable layer strips 925 and the row electrodes 905. As noted above, those skilled in the art will understand that in some embodiments the row electrode 905 is part of an optical stack (such as the optical stack 16 illustrated in FIGS. 7A-7E), and that other portions of the optical stack may be omitted from the drawings for clarity.

The display 1100 differs from the display 900 at least in regards to the configuration of the etch release holes. The etch release holes 930 of the display 900 in FIG. 9 comprise a generally circular cross section and were all located in the interior portion of the pixel region 950. The display 1100 includes elongated interior etch release holes 1105 within the pixel regions 950. The display 1100 also includes elongated etch release holes 1110 located over the support rails 910. The elongated etch release holes are substantially parallel to the parallel strips 925 of the movable reflective layer. It is believed that because the elongated etch release holes 1105 and 1110 are elongated in substantially the same direction as the channels 955, the stress state of the parallel strips 925 are more uniform after release of the sacrificial layer. The example display 1100 in FIG. 11 has only one elongated interior etch release hole 1105 in each of the pixel regions 950. Other embodiments may have more elongated interior etch release holes 1005. Similarly, the example display 1100 has one elongated edge etch release hole 1110 over each edge support rail 910 between two pixel regions 950. Other embodiments may have more elongated etch release holes 1110 over the edge support rails 910. The display 1100 may also have elongated etch release holes located over elongated interior posts such as the interior posts 1005 shown in FIG. 10.

The elongated etch release holes 1105 and 1110 in FIG. 11 are depicted as having generally circular or elliptical end portions with linear center portions. Other elongated cross sections may also be used such as, for example, elliptical, rectangular, and others.

Figure 13:
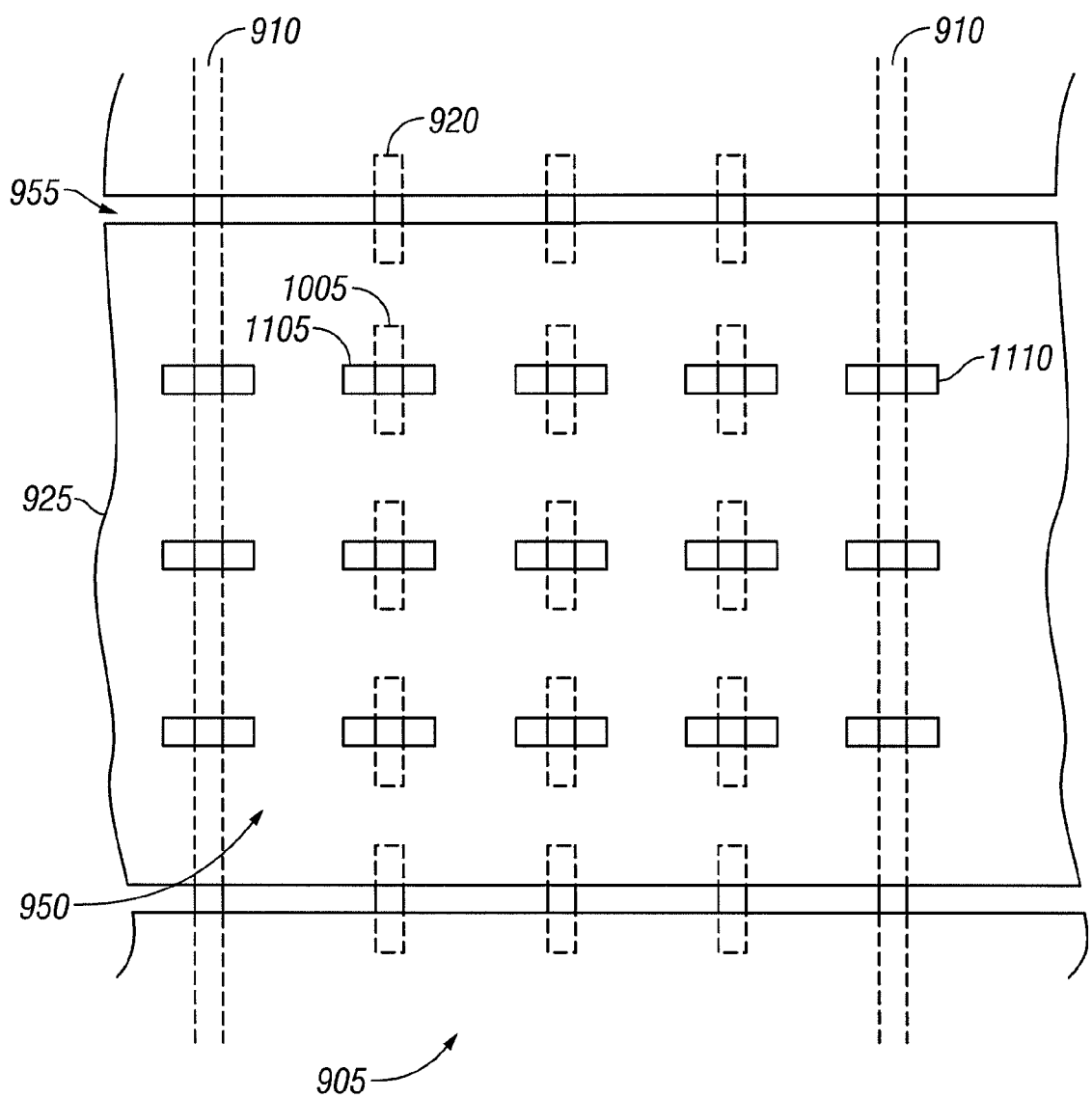
FIG. 13 is a view depicting one embodiment of a pixel configuration of an interferometric modulator including support rails, elongated support posts and elongated release holes providing a more uniform stress state in the movable reflective layer.

Those skilled in the art will recognize that the display 1000 of FIG. 10 may include the elongated etch release holes 1105 and 1110 depicted in FIG. 11. Similarly, the display 1100 of FIG. 11 may include the elongated interior posts 1005 and the edge posts 920. In some embodiments having both the interior elongated posts 1005 and the interior elongated etch release holes 1105, the elongated etch release holes 1105 at least partially overlap the interior elongated posts 1005 as illustrated in FIGS. 13 and 14.

Figure 12:
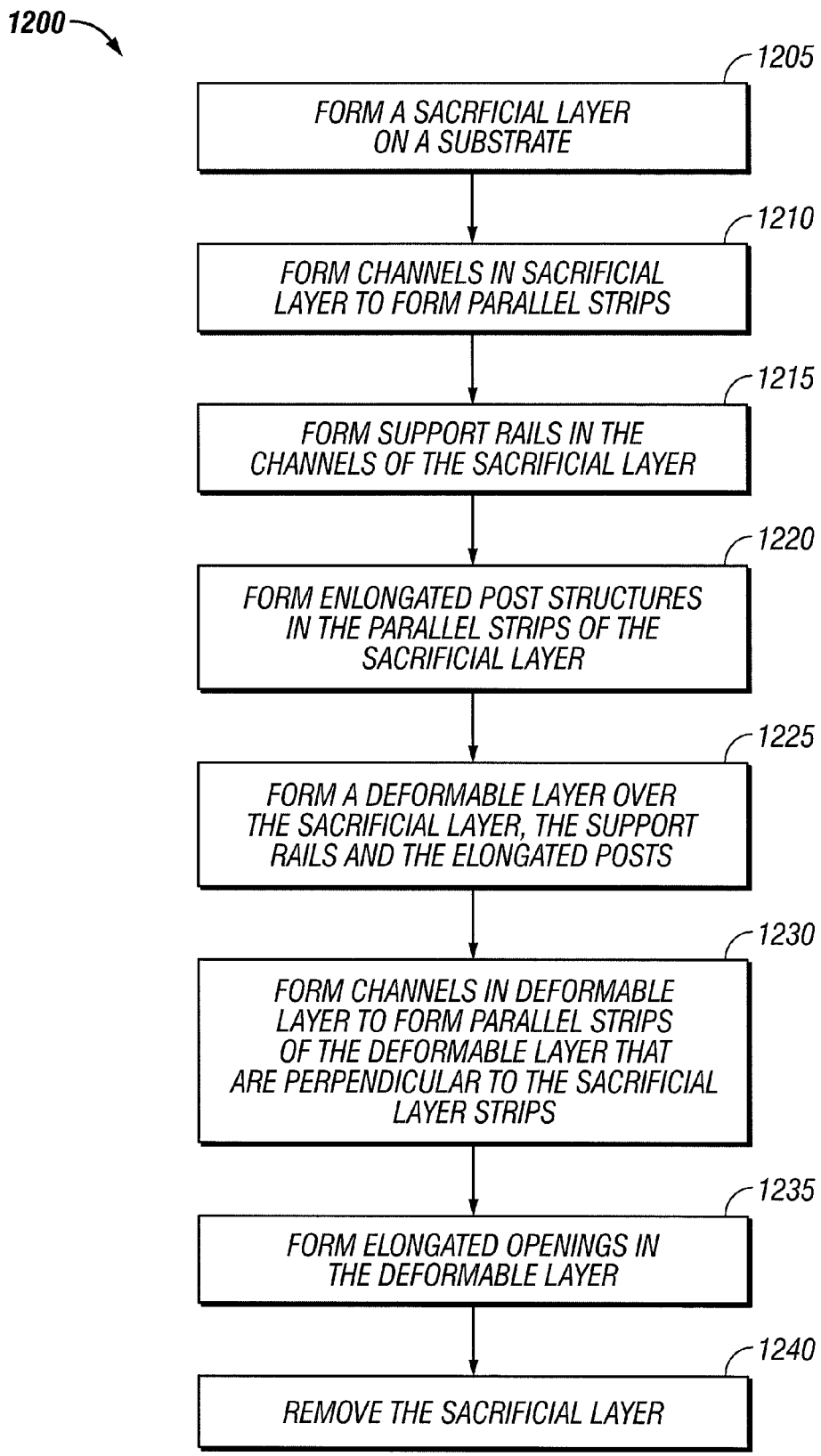
FIG. 12 is a flow diagram illustrating certain steps in another embodiment of a method of making an interferometric modulator.

FIG. 12 is a flow diagram illustrating certain steps in an embodiment of a method of making an interferometric modulator, for example, as illustrated in FIGS. 10 and 11. Those skilled in the art will understand that, depending on the particular materials selected, some embodiments of the method will include additional steps, for example, forming etch stops and/or hard masks. Those skilled in the art will also understand that in some embodiments, some steps are performed in different orders and/or combined. This description makes reference to certain structures illustrated in FIGS. 7A-7E and FIGS. 9, 10 and 11.

In step 1205 a sacrificial layer is formed on a substrate 20. The substrate 20 may be a transparent substrate such as glass or plastic. In some embodiments, the substrate comprises an optical stack 16 formed on the substrate 20 as described above. In some embodiments, as discussed above, the optical stack 16 includes an electrode layer that is electrically conductive, partially transparent and partially reflective, and may be fabricated, for example, by depositing one or more of the layers onto the transparent substrate 20. The sacrificial layer is later removed (e.g., at step 1240) to form the cavity 19 as discussed above and thus the sacrificial layer is not shown in the resulting interferometric modulators illustrated in FIG. 7, 9, 10 or 11.

The formation of the sacrificial layer over the substrate and/or the optical stack 16 may include deposition of a $XeF_2$-etchable material such as molybdenum or amorphous silicon, in a thickness selected to provide, after subsequent removal, a cavity 19 having the desired size. In some embodiments, the thickness of the sacrificial layer is substantially uniform. The sacrificial layer comprises a sacrificial material. Suitable sacrificial materials are known in the art, for example, inorganic sacrificial materials and organic sacrificial materials. Examples of suitable inorganic sacrificial materials include silicon, titanium, zirconium, hafnium, vanadium, tantalum, niobium, molybdenum, and tungsten. Examples of suitable organic sacrificial materials include polymeric materials known in the art, including photoreactive polymers, photoresists, and polymers such as polymethylmethacrylate (PMMA). Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating. In some embodiments, formation of the sacrificial layer may include one or more patterning steps followed by deposition of one or more additional sacrificial layers, thereby forming a multiple sacrificial layer. This may be done in order to form different thicknesses of sacrificial layers underlying the deformable layer in order to provide cavities of different depths (e.g., for fabricating interferometric modulators providing different colors).

In step 1210, channels are formed in the sacrificial layer to form parallel strips of the sacrificial layer using methods known in the art. The remaining parallel strips of sacrificial material occupy the space in the cavities 19 that will be formed between the row electrodes 905 and the parallel strips 925 of the deformable layer upon removal of the sacrificial layer. In some embodiments, the layers of the optical stack 16 are patterned into parallel strips in the same step 1210 as the patterning of the sacrificial layer, and may comprise the row electrodes 905 in a display device. In some embodiments, the layers of the optical stack 16 may be patterned into parallel strips prior to forming the sacrificial layer at step 1205. In these embodiments, the channels formed in the sacrificial layer at the step 1210 may coincide with the channels formed in patterning the optical stack.

In step 1215, support rails 910 are formed in the channels of the sacrificial layer that were formed in the step 1210. In some embodiments, the support rail material comprises a self-planarizing material such as a photoresist or other types of spin on materials. In some embodiments, the support rail material comprises a black matrix polymer. The black matrix offers improved visual characteristics for viewing the display through the transparent substrate 20. In some embodiments, the support rail material comprises an inorganic material, such as a silicon oxide or a metal oxide. In some embodiments, the support rail material layer is conformal. In any of these embodiments, the support rail material is chosen such that a selective etch can remove the sacrificial materials of the sacrificial layer selectively relative to the support rail material.

In step 1220, elongated post structures are formed in the parallel strips of the sacrificial layer. The elongated posts may be formed in elongated openings formed (e.g., by patterning and etching) in the sacrificial layer during the step 1210 when the channels are formed in the sacrificial layer. Alternatively, the elongated openings for forming the elongated posts may be formed as part of the step 1220. The elongated posts can include interior posts 1005 located within the cavity 19 that may be formed upon removal of the sacrificial layer between the row electrodes 905 and the parallel strips 925. The elongated posts can also include elongated edge posts 920. The elongated interior posts 1005 are formed substantially parallel to the support rails 910 as discussed above. Those skilled in the art will understand that the steps 1215, 1220 can be carried out simultaneously or sequentially, e.g., the methods used to form the elongated posts 920, 1005 at the step 1220 can also be used to form the support rails 910 at the step 1215. The elongated posts may be formed of the same or different materials as the support rails 910.

In step 1225, a deformable layer is formed over the remaining sacrificial layer, the support rails 910, the edge posts 920 and the elongated posts 1005. The support rails 910, the edge posts 920 and the elongated interior support posts 1005 support the deformable layer on a lower surface of the deformable layer facing the substrate. The deformable layer comprises a conductive material and a reflective surface for reflecting light in the visible or non-visible spectrum, for example, aluminum, titanium, chromium, silver, or gold. Methods for forming the deformable reflective layer are known in the art, for example, PVD, CVD, ALD (atomic layer deposition) and variants thereof.

In step 1230, channels 955 are formed in the deformable layer to form the parallel strips 925. As discussed above, the channels 955 and the resulting parallel strips 925 are substantially perpendicular to the support rails 910 defining the parallel strips of the sacrificial layer. The channels 955 may be patterned and etched from the deformable layer. A variety of methods can be used to perform the patterning and etching of the deformable layer at the step 1230, as well as other etches performed in the process 1200. The etches used may be either a dry etch (e.g., reactive ion etch (RIE)) and/or a wet etch, and may be isotropic or anisotropic.

In step 1235, elongated openings are formed in the deformable layer. The elongated openings may include the elongated interior etch release holes 1105 and/or the elongated etch release holes 1110 over the support rails 910. As discussed above, the elongated etch release holes 1105 and 1110 are substantially parallel to the channels 955 formed in the deformable layer at the step 1225. Those skilled in the art will understand that the steps 1230, 1235 can be carried out simultaneously or sequentially, e.g., the methods used to form the elongated openings 1105, 1110 at the step 1235 can also be used to form the channels 955 at the step 1230.

In step 1240, the sacrificial layer is substantially completely removed and/or etched away to form the cavities 19 between the parallels strips 925 of the deformable layer and the row electrodes 905. Those skilled in the art will understand that the particular etching conditions depend on the identity of the sacrificial material. In some embodiments, the sacrificial material is selectively removed relative to other structures in the device, for example, the support rails 910, the support posts 920 and/or 1005 and the electrodes of the optical stack and the deformable layer. In some embodiments, the sacrificial material is removed by ashing, for example, where the second sacrificial material is a resist, a photoresist, or a planarization material. In other embodiments, the sacrificial material is etched away by another method known in the art, for example, by reactive ion etching and/or using a gas phase etchant (e.g., $XeF_2$). Structures resulting from removing sacrificial materials are generally illustrated in FIGS. 10 and 11.

It should be noted that various steps of the process 1200 can be omitted and/or rearranged, depending on the embodiment.

As discussed above, the cross sections and orientations of the elongated interior posts 1005 and the elongated etch release holes 1105 and 1110 are believed to improve the uniformity of the stress state of the deformable layer and result in a more uniform color distribution across the pixel region 950. In addition to improving the stress state of the deformable layer, the larger dimensions of the posts and openings can advantageously simplify the manufacturing process. The larger dimensions allow for use of less precise equipment in patterning the portions to be etched in forming the support posts and the etch release holes. When manufacturing the interferometric modulator with support posts and etch release holes as shown in FIG. 9, the circular etch release holes and circular interior posts may have diameters of 4 μm or smaller depending on the size of the pixel region. Pixel regions may have horizontal and vertical dimensions of about 30 μm to about 250 μm. Manufacturing this small diameter generally involves the use of devices and processes capable of a feature size of 4 μm or smaller. The elongated etch release holes and interior posts described herein may be designed with minimum feature sizes of about 4 μm, 5 μm, 6 μm, 7 μm, 8 μm, 9 μm, 10 μm, or even larger. The minimum feature size may depend on the precision of equipment used in the manufacturing process. Regardless of the minimum feature size, a large elongation ratio can be provided. For example the posts and etch release holes could all have a short width of about 10 μm and, depending on the elongation ratio, an elongated length of about 15 μm, 20 μm, 25 μm, 30 μm or larger. Thus, a manufacturing process providing a feature size of about 10 μm could be used to manufacture the interferometric modulator comprising these larger elongated structures.

It has also been found that by overlapping the elongated etch release holes 1105 and/or 1110 with the support rails 910 and/or the elongated interior posts 1005, less precise alignment can also be tolerated. FIG. 13 is a view depicting one embodiment of a pixel configuration of an interferometric modulator including support rails, elongated support posts and elongated release holes providing a more uniform stress state in the movable reflective layer. This embodiment shows a single pixel region 950 defined by an overlap between a parallel strip 925 (bordered by the channels 955) of the deformable reflective layer and a row electrode 905 (bordered by the support rails 910). This embodiment also features elongated interior etch release holes 1105 overlapping elongated interior posts 1005, and elongated etch release holes 1110 overlapping support rails 910. This embodiment shows nine interior etch release holes 1105 overlapping nine interior posts 1005, However, other numbers of holes and posts may be used. This embodiment also shows 3 edge posts 920 supporting the adjacent parallel strips 925 of the deformable layer.

Figure 14A:
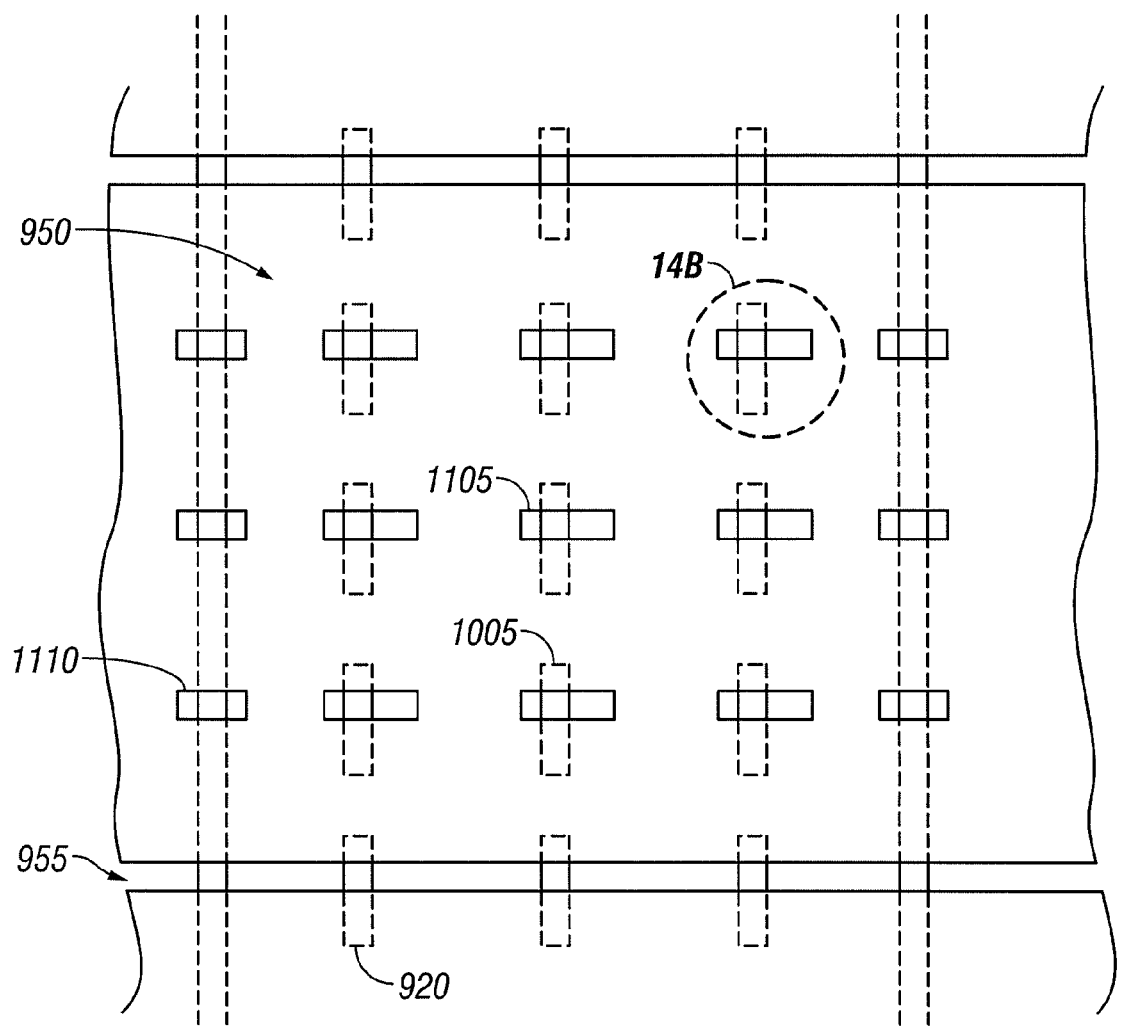
FIGS. 14A and 14B are views depicting a misalignment between the elongated support posts and the elongated release holes of the interferometric modulator of FIG. 13.
Figure 14B:
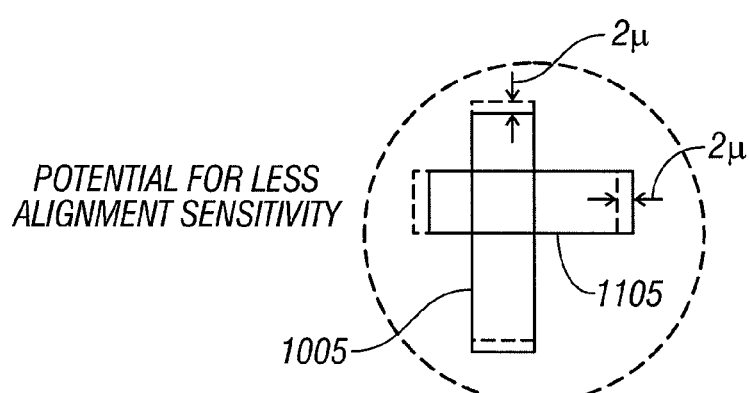

FIG. 13 shows a well-aligned interferometric modulator where the holes 1105 and 1110 are relatively precisely centered over the posts 1005 and rails 910. However, perfect alignment is difficult if not impossible to consistently achieve in practical manufacturing environments. FIG. 14A is a view depicting a possible misalignment between the elongated support posts 1005 and the elongated release holes of the interferometric modulator of FIG. 13. The example illustrates a misalignment of about 2 μm in both the vertical and horizontal directions (see exploded view of FIG. 14B). The interior posts 1005, edge posts 920 and etch release holes 1105 and 1110 are all depicted with 30 μm by 10 μm dimensions. This 2 μm misalignment is rather severe and typically results in correspondingly severe distortion of the color across the pixel region 950 (e.g., in the configuration of interferometric modulator shown in FIG. 9). However, the configuration of elongated etch holes and support posts parallel to the channels 955 in the deformable layer and the support rails 910, respectively, exhibits surprisingly little color distortion.

The larger etch release holes 1105 and 1110 and post structures 1005 and 920 take away from the reflective surface area in the pixel region 950. By overlapping the etch release holes 1105 and 1110 with the support posts 1005 and the support rails 910, less of the reflective area of the pixel region 950 is lost. This is another benefit of the overlapping holes and support structures shown in FIGS. 13 and 14A and 14B.

The amount of reflective area lost due to the support posts 1005 and the etch release holes 1105 and 1110 may be reduced further by reducing the minimum feature size of these structures, e.g., to about 4 μm as discussed above.

An embodiment of an interferometric modulator includes means for transmitting light, means for reflecting light, the reflecting means being movable towards or away from the transmitting means, and means for supporting the reflecting means and for improving uniformity of a stress state of the reflecting means. With reference to FIG. 10, aspects of this embodiment include where the transmitting means is an optical stack 16, where the reflecting means is a deformable layer 925, and where the supporting means are two rails 910 and an elongated post 1005, where the two rails 910 border opposite sides of a cavity 19 between the reflecting means and the transmitting means and the elongated post 1005 is located entirely within the cavity 19 and is aligned parallel with the rails 910 in the elongate direction.

Another embodiment of an interferometric modulator includes means for transmitting light, means for reflecting light, the reflecting means being movable towards or away from the transmitting means, means for supporting the reflecting means, and means for venting an etch gas from a cavity between the reflecting means and the transmitting means and for improving uniformity of a stress state of the reflecting means. With reference to FIG. 10, aspects of this embodiment include where the transmitting means is an optical stack 16, where the reflecting means comprises a deformable layer 925, where the supporting means comprises two rails 910, where the two rails 910 border opposite sides of the cavity, and where the venting means comprises an elongated opening 1105 in the reflecting means, the elongated opening 1105 being aligned perpendicular to the supporting means.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making an electromechanical device, comprising:
   forming a sacrificial layer over a substrate;
   forming two or more substantially parallel first channels in the sacrificial layer to thereby form at least one strip of the sacrificial layer;
   forming support rails in the formed first channels;
   forming a first elongated opening in the strip of the sacrificial layer;
   forming an elongated post in the first elongated opening;
   forming a deformable layer over the sacrificial layer, the support rails and the elongated post;
   forming one or more second channels in the deformable layer to thereby form at least one strip of the deformable layer, the strip of the deformable layer being substantially perpendicular to the strip of the sacrificial layer; and
   removing the sacrificial layer to form a cavity between the strip of the deformable layer and the substrate, the cavity being bordered on two sides by the support rails;
   wherein the support rails support the deformable layer on the two sides of the cavity; wherein the elongated post is within the cavity; and wherein the elongated post is aligned so that the elongate direction is substantially parallel to the substrate and to the support rails.

2. The method of claim 1, further comprising forming at least one elongated opening in the deformable layer prior to removing the sacrificial layer, the elongated opening being aligned substantially parallel to the second channel formed in the deformable layer.

3. The method of claim 2, wherein at least one of the elongated openings is located over one of the elongated posts.

4. The method of claim 2, wherein at least one of the elongated openings is located over one of the support rails.

5. The method of claim 1, wherein forming the one or more second channels results in two parallel strips of the deformable layer, the method further comprising:
forming a second elongated opening in the strip of the sacrificial layer; and
forming a second elongated post in the second elongated opening,
wherein the elongate direction of the second elongated post is substantially parallel to the support rails and wherein the second elongated post is positioned to support the two parallel strips of the deformable layer.

6. The method of claim 5, wherein the first and second elongated posts have substantially the same dimensions.

7. An interferometric modulator made by the method of claim 1.

8. A method of making an electromechanical device, comprising:
forming a sacrificial layer over a substrate;
forming two or more substantially parallel first channels in the sacrificial layer to thereby form at least one strip of the sacrificial layer;
forming support rails in the formed first channels;
forming a deformable layer over the sacrificial layer and over the support rails;
forming one or more second channels in the deformable layer to thereby form at least one strip of the deformable layer, the strip of the deformable layer being substantially perpendicular to the strip of the sacrificial layer;
forming one or more first elongated openings in the strip of the deformable layer, wherein the elongate direction of the first elongated opening is substantially parallel to the strip of the deformable layer; and
removing the sacrificial layer to form a cavity between the strip of the deformable layer and the substrate, the cavity being bordered on two sides by the support rails.

9. The method of claim 8, further comprising:
forming one or more second elongated openings in the strip of the sacrificial layer, wherein the elongated direction of the elongated second opening is aligned substantially perpendicular to the strip of the sacrificial layer; and
forming one or more elongated posts in the second elongated openings.

10. An electromechanical device, comprising:
a substrate;
a plurality of deformable membranes;
a plurality of support structures arranged over the substrate and configured to support the deformable membranes; and
a plurality of cavities defined by the substrate, the support structures, and the deformable membranes;
wherein the plurality of support structures comprise support rails aligned in a first direction separating the plurality of cavities into one or more rows, and at least one elongated support post located between the support rails and located entirely within one of the cavities, and further wherein the elongated support post is aligned so that the elongate direction is substantially parallel to the substrate and to the support rails.

11. The device of claim 10, wherein the plurality of support structures are formed from the same material.

12. The device of claim 10, wherein the plurality of support structures support the deformable membranes on a lower surface of the deformable membranes facing the substrate.

13. The device of claim 10, wherein the plurality of deformable membranes are configured in two or more columns, each column comprising two or more of the cavities, the columns being substantially perpendicular to the one or more rows, wherein the deformable membranes comprise at least one elongated opening formed in the deformable membrane, where the axis of elongation of the elongated opening is substantially parallel to the two or more columns.

14. The device of claim 10, wherein the plurality of deformable membranes are configured in two or more columns, each column comprising two or more of the cavities, the columns being substantially perpendicular to the one or more rows, wherein the plurality of support structures further comprise at least one elongated edge post configured to support the two columns of the deformable membranes.

15. The device of claim 14, wherein the elongated support post in the interior of the cavity and the elongated edge post have substantially the same dimensions.

16. An array of interferometric modulators comprising the device of claim 10.

17. A display device comprising:
an array of interferometric modulators as claimed in claim 16;
a processor that is configured to communicate with the array, the processor being configured to process image data; and
a memory device that is configured to communicate with the processor.

18. The display device of claim 17, further comprising a driver circuit configured to send at least one signal to the array.

19. The display device of claim 18, further comprising a controller configured to send at least a portion of the image data to the driver circuit.

20. The display device of claim 18, further comprising an image source module configured to send the image data to the processor.

21. The display device of claim 20, wherein the image source module comprises at least one of a receiver, transceiver, and transmitter.

22. The display device of claim 18, further comprising an input device configured to receive input data and to communicate the input data to the processor.

23. An electromechanical device, comprising:
a substrate;
two or more electrically conductive row electrodes formed on the substrate;
a plurality of support rails formed on the substrate and configured to separate the two or more row electrodes;
two or more deformable column electrodes supported by the plurality of support rails, the column electrodes being substantially perpendicular to the row electrodes;
a plurality of elongated openings formed in the deformable column electrodes, where the elongated openings are aligned such that the elongate direction is substantially parallel to the column electrodes; and
an array of cavities defined by the row electrodes, the support rails, and the deformable column electrodes;
wherein at least one elongated opening is at least partially located in each of the cavities.

24. The device of claim 23, further comprising one or more elongated posts formed on the substrate and located at least partly within one of the cavities and supporting one or more of the deformable column electrodes, the axis of elongation of the elongated post being substantially parallel to the row electrodes.

25. The device of claim 24, wherein at least one of the elongated posts is configured to support two of the column electrodes in an edge space between the two column electrodes.

26. The device of claim 24, wherein at least one of the elongated posts is positioned in the interior of one of the cavities.

27. The device of claim 26, wherein at least one of the elongated openings overlaps a portion of the elongated post positioned in the interior of the cavity.

28. The device of claim 23, wherein at least one of the elongated openings overlaps a portion of one of the support rails.

29. An interferometric modulator comprising:
means for transmitting light;
means for reflecting light, the reflecting means being movable towards or away from the transmitting means; and
means for supporting the reflecting means and for improving uniformity of a stress state of the reflecting means, wherein the supporting means comprises two rails and an elongated post, where the two rails border opposite sides of a cavity between the reflecting means and the transmitting means and the elongated post is located entirely within the cavity and is aligned parallel with the rails and parallel with the reflecting means in the elongate direction.

30. The interferometric modulator of claim 29, wherein the transmitting means comprises an optical stack.

31. The interferometric modulator of claim 29, wherein the reflecting means comprises a deformable membrane.

32. An interferometric modulator comprising:
means for transmitting light;
means for reflecting light, the reflecting means being movable towards or away from the transmitting means;
means for supporting the reflecting means; and
means for venting an etch gas from a cavity between the reflecting means and the transmitting means and for improving uniformity of a stress state of the reflecting means.

33. The interferometric modulator of claim 32, wherein the transmitting means comprises an optical stack.

34. The interferometric modulator of claim 32, wherein the reflecting means comprises a deformable membrane.

35. The interferometric modulator of claim 32, wherein the supporting means comprises two rails, where the two rails border opposite sides of the cavity.

36. The interferometric modulator of claim 32, wherein the venting means comprises an elongated opening in the reflecting means, the elongate direction of the elongated opening being aligned perpendicular to an elongate direction of the supporting means.

* * * * *